(12) United States Patent
Lien et al.

(10) Patent No.: US 6,400,593 B1
(45) Date of Patent: Jun. 4, 2002

(54) TERNARY CAM CELL WITH DRAM MASK CIRCUIT

(75) Inventors: Chuen-Der Lien, Los Altos Hills; Chau-Chin Wu, Cupertino, both of CA (US)

(73) Assignee: Intregrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/780,714

(22) Filed: Feb. 8, 2001

(51) Int. Cl.$^7$ .............................................. G11C 15/00
(52) U.S. Cl. .......................................... 365/49; 365/168
(58) Field of Search ........................ 365/49, 168, 149, 365/129

(56) References Cited

U.S. PATENT DOCUMENTS

| | | | |
|---|---|---|---|
| 5,841,874 A | 11/1998 | Kempke et al. ............... 380/50 |
| 6,191,969 B1 | * 2/2001 | Pereira .......................... 365/49 |
| 6,240,004 B1 | * 5/2001 | Kuo et al. ..................... 365/49 |
| 6,266,262 B1 | * 7/2001 | Washburn et al. ............. 365/49 |

* cited by examiner

Primary Examiner—Hoai V. Ho
(74) Attorney, Agent, or Firm—Bever, Hoffman & Harms LLP

(57) ABSTRACT

A ternary CAM cell including a binary SRAM CAM cell connected in series with a mask transistor between a match line and a discharge line, and a DRAM mask circuit for applying a mask (care/don't care) value to the gate terminal of the mask transistor. The binary CAM cell stores a data value that is compared with an applied data value, and opens the first portion of a discharge path between the match line and the discharge line when the applied data value fails to match the stored data value. The mask transistor is controlled by the DRAM mask circuit, which includes two associated DRAM memory cells that are connected by a bit line to a sense amplifier. The DRAM mask circuit is refreshed such that, during a read phase of the refresh operation, a data value is read only from the first DRAM memory cell and registered (refreshed) by the sense amplifier circuit. In the subsequent write phase of the refresh operation, the data value is written to the second DRAM memory cell. The storage node of the second DRAM memory cell is connected to the gate terminal of the mask transistor.

21 Claims, 5 Drawing Sheets

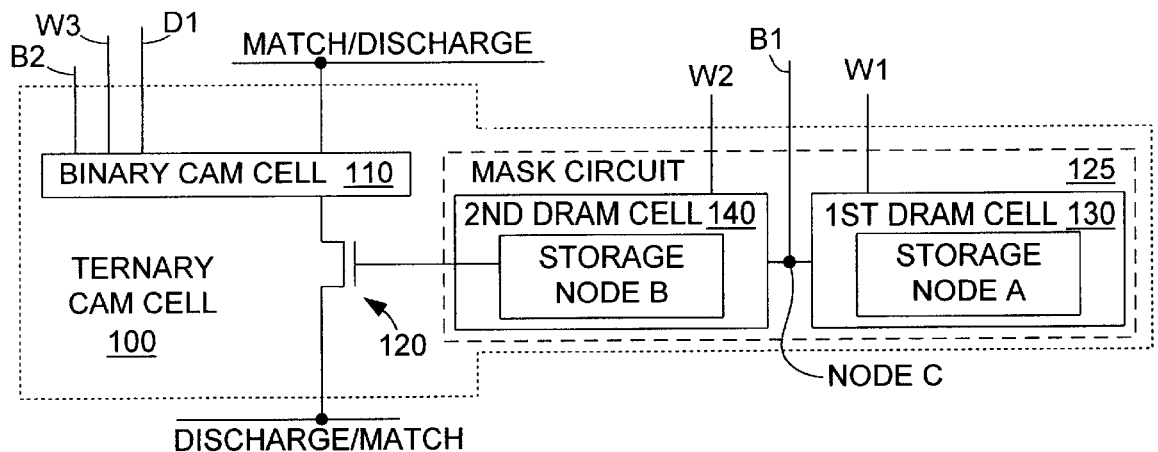
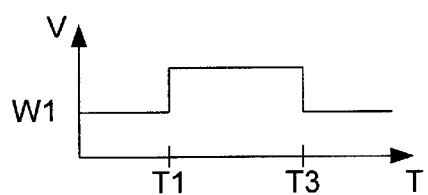
FIG. 2(A)
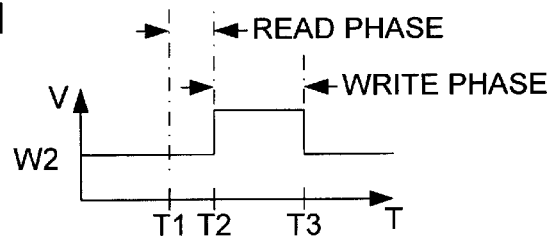
FIG. 2(B)
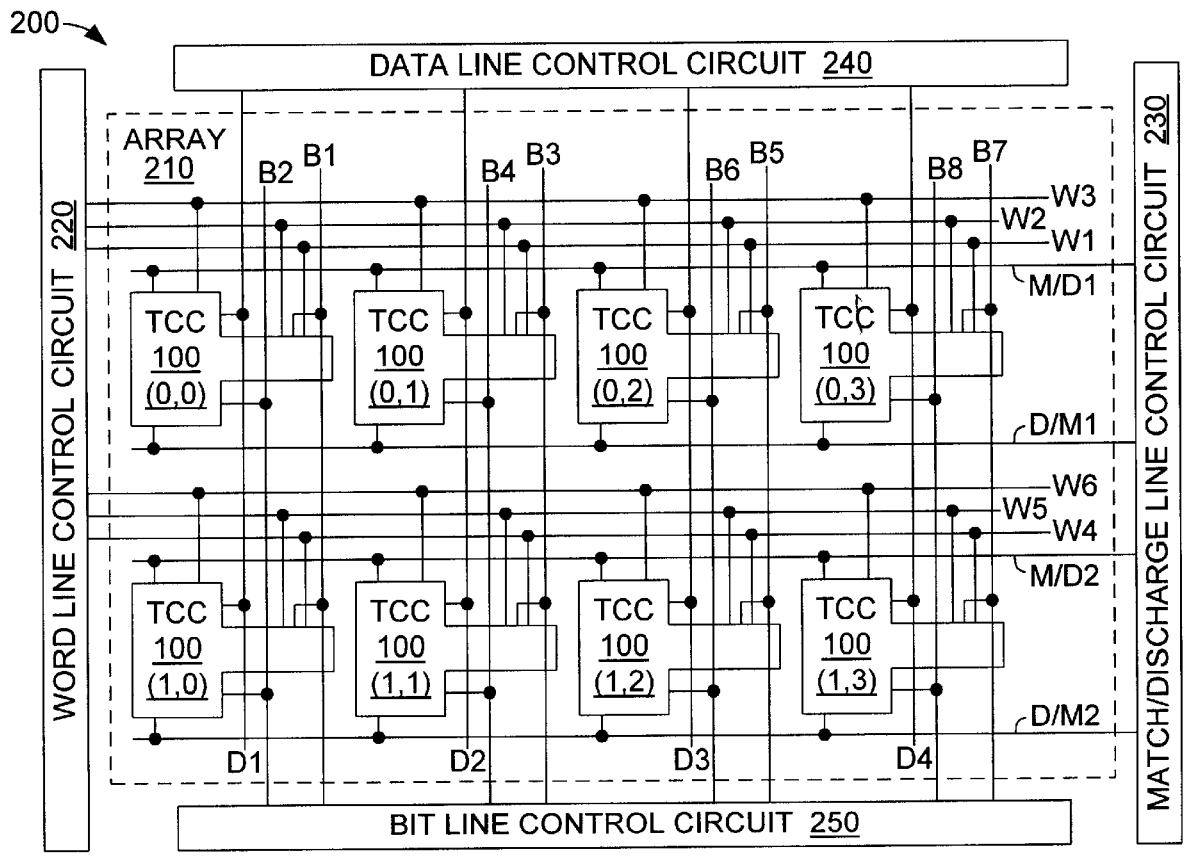
FIG. 3

TERNARY CAM CELL WITH DRAM MASK CIRCUIT

FIELD OF THE INVENTION

The present invention relates to content addressable memory (CAM) arrays. More specifically, the present invention relates to CAM arrays including ternary CAM cells.

DISCUSSION OF RELATED ART

Semiconductor memory devices fall into two broad categories: read only memory (ROM) devices, and read-write or "random access" memory (RAM) devices. ROM (e.g., EPROM or EEPROM) devices are non-volatile devices primarily used to store data when system power is turned off. In contrast, RAM devices temporarily store data that is used during system operation. RAM devices are typically volatile in that the data stored in a RAM device is lost when power is turned off. RAM devices are roughly divided into two types: static random access memory (SRAM) devices, and dynamic random access memory (DRAM) devices.

An SRAM device consists of a basic bistable flipflop circuit that needs only an applied DC current to retain a data value. To store a logic "1" data value (bit), the bistable flipflop is biased into a first stable state, and to store a logic "0" data value, the bistable flipflop is biased into its second stable state. The bistable flipflop maintains the first or second stable state until an opposite biasing voltage is applied that "flips" the bistable flipflop from the first to the second (or the second to the first) stable state. While the stable data storage of SPAM devices provides certain advantages, a main disadvantage of SRAM devices is their relatively large size due to the multiple (typically six or more) transistors required to form and access the bistable flipflop circuit.

In contrast to SRAM devices, DRAM devices stores a data value as a charge on a capacitor or wire (referred to herein as a "storage node"). The main advantage of DRAM devices is that a basic DRAM memory cell requires only a single transistor and a capacitor (or wire), thereby making DRAM cells significantly smaller and less expensive to produce than SRAM cells. The main disadvantage of DRAM devices is that the data values stored in the storage node decay over time, thereby requiring refresh circuitry that periodically reads and rewrites (refreshes) the stored data values to prevent their loss. Due to the sensitivity typical of DRAM devices, this refresh operation must be performed independent of other (e.g., read or write) operations. In particular, the data value (voltage) stored in the storage node of a DRAM memory cell is read using a sense amplifier during a read phase of the refresh operation, and then the sense amplifier refreshes (rewrites) the sensed data value during a write phase of the refresh operation. Due to the read phase of the refresh operation, the number of memory cells in each column of a DRAM array must be minimized. That is, the length (i.e., capacitance) of bit lines increases with the number of DRAM memory cells arranged in a column that are connected to these lines. Because the data values are partially decayed before being transmitted from each DRAM memory cell onto bit lines, this capacitance can generate read phase errors if the bit lines are too long. In particular, this sensitivity restricts the use of DRAM devices in the direct control a logic gate or the gate terminal of a pass transistor in an integrated circuit.

Conventional RAM arrays include RAM cells arranged in rows and columns, and addressing circuitry that accesses a selected row of RAM cells using address data corresponding to the physical address of the RAM cells. That is, data words stored in the rows of conventional RAM cells are accessed by applying address signals to the RAM array input terminals. In response to each unique set of address signals, a RAM array outputs a data word that is read from a group of RAM cells designated by the address.

Unlike conventional RAM arrays, content addressable memory (CAM) arrays include CAM cells that are addressed in response to their content, rather than by a physical address within a RAM array. Specifically, a CAM array receives a data word that is compared with all of the data values stored in the CAM cells located in each row of the CAM array. In response to each unique data word applied to the CAM array input terminals, the rows of CAM cells within the CAM array assert or de-assert associated match signals indicating whether or not all of the data values stored in the CAM cells of a row match the applied data word. CAM arrays are useful in many applications, such as search engines.

Similar to conventional RAM devices, CAM cells can either be formed as DRAM devices, in which data values are stored in storage nodes formed by capacitors or wires, or SRAM devices, in which data values are stored using bistable flipflop circuits. Similar to conventional RAM cells, DRAM CAM cells provide an advantage in that they are typically smaller than SRAM CAM cells, but require a refresh operation that can impede high speed match operations. In addition, DRAM CAM arrays are typically limited in size due to the capacitance problems, discussed above, that are associated with DRAM memory cells. In contrast, SRAM memory cells typically require more transistors (and, hence, more substrate area) than DRAM cells, but avoid the capacitance problems associated with DRAM CAM cells.

CAM cells are typically defined by the number of data values that they store. For example, binary CAM cells stores one of two logic values: a logic high value or a logic low value. Ternary CAM cells store one of three logic values: a logic high value, a logic low value, and a "don't care" logic value. A "don't care" logic value is a logic value that produces a match condition for any applied compare data value. When the logic value stored in a ternary CAM cell matches an applied data value, assuming all other CAM cells coupled to the CAM array row also match, then the voltage on the match line coupled to the ternary CAM cell is maintained at the match value (e.g., a logic high value), thereby indicating that a match has occurred. In contrast, when the logic value stored in the ternary CAM cell does not match an applied data value, then the voltage on the match line coupled to the ternary CAM cell is changed to the no match value (e.g., pulled down to a logic low value), thereby indicating that a match has not occurred. A ternary CAM cell storing a "don't care" value will provide a match condition for any data value applied to that CAM cell. This "don't care" capability allows CAM arrays to indicate when a data value matches a selected group of ternary CAM cells in a row of the CAM array.

Higher order CAM cells store additional data values. For example, a four state ("quad" CAM cell stores a logic high value, a logic low value, a logic high "don't care" value, and a logic low "don't care" value. Thus, a CAM cell storing four states beneficially stores a data value (e.g., a high or low value) and simultaneously indicates whether that data value is to be involved in a match operation (e.g., a logic high or a logic high "don't care"). As a result, a read operation on a four-state CAM cell storing a "don't care" value distinguishes the "don't care" value read from the CAM cell as either a logic high "don't care" value or a logic low "don't care" value. Match operations performed by a four-state CAM cell are similar to the ternary CAM cell described above.

FIG. 10 is a schematic diagram of a conventional ternary CAM cell 1000. CAM cell 1000 is a sixteen-transistor (16-T) device including two 6-transistor (6-T) SRAM cells 1001A and 1001B and a 4-T exclusive-NOR (comparator) circuit 1001C. SRAM cell 1001A includes n-channel transistors 1010, 1011, 1014, and 1015 and p-channel transistors 1022 and 1023. Transistors 1014, 1015, 1022, and 1023 are cross-coupled to form a storage latch having storage node $N_1$ and inverted storage node $N_1\#$. Access transistors 1010 and 1011 couple storage node $N_1\#$ and $N_1$, respectively, to inverted bit line $B_1\#$ and bit line $B_1$, respectively. Similarly, SRAM cell 1001B includes n-channel transistors 1016 and 1017 and p-channel transistors 1024 and 1025, which are cross-coupled to form a storage latch having node $N_2$ and inverted storage node $N_2\#$, and access transistors 1012 and 1013, which couple storage nodes $N_2\#$ and $N_2$, respectively, to inverted bit line $B_2\#$ and bit line $B_2$, respectively. Exclusive NOR circuit 1001C includes n-channel transistors 1018–1021. Transistors 1020 and 1018 are coupled in series between a match line $MATCH_1$ and a steady state supply source (i.e., $V_{ss}$ or ground). The gate terminal of transistor 1020 is coupled to node $N_1$ and the gate of transistor 1018 is coupled to an inverted data line $D_1\#$. Similarly, transistors 1021 and 1019 are coupled in series between the match line and the steady state supply source. The gate of transistor 1021 is coupled to node $N_2\#$ and the gate of transistor 1019 is coupled to a data line $D_1$.

Ternary CAM cell 1000 stores one of a logic high, a logic low, and a logic "don't care" value by selectively storing data values in nodes $N_1$ and $N_2$, and inverted data values in nodes $N_1\#$ and $N_2\#$, during a write operation. During subsequent read operations, the values stored in nodes $N_1$, $N_2$, $N_1\#$ and $N_2\#$ are provided on bit lines $B_1$ and $B_2$ and inverted bit lines $B_1\#$ and $B_2\#$, respectively. During a compare operation, the value stored in node $N_2\#$ is compared to a data value and the value stored in node $N_1$ is compared to an inverted data value. Depending upon the outcome of this comparison, match line $MATCH_1$ is either maintained in a charged state (indicating a match condition) or discharged to ground (indicating a no-match condition) in response to the applied data and inverted data values. As used herein, the term "discharged" means a voltage state is changed. Thus, in one embodiment, "discharged" may mean a logic high value of a match line is discharged to a logic low value or ground. In another embodiment, "discharged" may mean a logic low value of a match line is discharged to a logic high value or the $V_{cc}$ voltage supply source.

A problem with conventional ternary CAM cell 1000 is that the 16 transistors forming ternary CAM cell 1000 take up valuable chip area. It is preferred to minimize the number of transistors required to perform a function to maximize available chip area. Another problem with conventional ternary CAM cell 1000 is the space required by the six bit lines (i.e., $B_1$, $B_1\#$, $B_2$, $B_2\#$, $D_{1A}$, and $D_{1B}\#$) that are required to write data values to ternary CAM cell 1000. These many bit lines and associated connections similarly occupy valuable chip area. It would therefore be desirable to have a CAM cell having a minimized area that is capable of storing at least three values.

U.S. Pat. No. 5,841,874 discloses a 14-T ternary CAM cell including two 5-T memory cells and a 4-T comparator circuit. Although the size of this 14-T ternary CAM cell is smaller than that of ternary CAM cell 1000 (shown in FIG. 10), the 14-T ternary CAM cell requires a much more difficult read and write operations because the 5-T memory cells must be read and written separately via the comparator circuit.

What is needed is a ternary CAM cell having a minimum cell size that combines the stable operation of SRAM devices with the space saving benefits of DRAM devices, and avoids the complicated write and read operations associated with conventional reduced-size ternary SRAM CAM cells.

SUMMARY

The present invention is directed to a reduced size ternary CAM cell including a binary SRAM CAM cell connected in series with a mask transistor to form a discharge path between a match line and a discharge line, and a DRAM mask circuit that applies a mask (i.e., care/don't care) value to the gate terminal of the mask transistor. The binary SRAM CAM cell includes a single latch for storing a data value that is compared with applied data values during match operations, and the DRAM mask circuit includes two DRAM memory cells that cooperatively store and continuously apply the mask value to the gate terminal of the mask transistor. By combining a binary SRAM CAM cell and mask transistor with the DRAM mask circuit in accordance with the present invention, a ternary CAM cell is provided that combines the performance benefits of an SRAM CAM cell while using fewer transistors (and, hence, having a smaller size) than conventional ternary SRAM CAM cells.

During match operations, the binary SRAM CAM cell compares applied data values with a stored data value, and opens a portion of the discharge path when the applied data value fails to match the stored data value. The mask transistor is provided to perform the care/don't care function in accordance with the mask value stored in the DRAM mask circuit, thereby facilitating ternary CAM operations. When the mask value is logic "0" (i.e., low or "don't care"), the mask transistor is held open (turned off) such that the match line is unable to discharge even when a data value stored in the binary CAM cell fails to match an applied data value. Conversely, when the mask value is logic "1" (i.e., high or "care"), the mask transistor is continuously closed (turned on) such that, consistent with conventional binary CAM cells, the match line discharges to the discharge line when a data value stored in the binary CAM cell fails to match an applied data value.

In accordance with an aspect of the present invention, the DRAM mask circuit of each ternary CAM cell includes a first DRAM memory cell and a second DRAM memory cell that are connected to a single bit line (central node), and a storage node of the second DRAM memory cell is connected to the gate terminal of the mask transistor. Because the first and second DRAM memory cells are connected to a single bit line (central node), the first DRAM memory cell is able to refresh the second DRAM memory cell without requiring the mask value to be read from the second DRAM memory cell. Specifically, during a read phase of a refresh operation, a first word line signal is transmitted to the first DRAM memory cell to write a mask value from the storage node of the first DRAM memory cell to the bit line. A sense amplifier connected to the bit line then reads and amplifies (refreshes) the mask value transmitted on the bit line from the first DRAM memory cell. During the subsequent write phase of the refresh operation, a second word line signal is transmitted to the second DRAM memory cell, thereby writing the refreshed mask value from the bit line to the second DRAM memory cell. Accordingly, the mask value stored in the second DRAM memory cell and applied to the mask transistor is refreshed without reading the mask value from the second DRAM memory cell, thereby avoiding the problems associated with conventional single DRAM memory cell control circuits.

In accordance with another aspect of the present invention, a CAM circuit includes an array of ternary CAM cells that are accessed by associated control circuits. Data values are written to and read from each binary SRAM CAM cell using first word and bit lines, and mask values are written to and read from each DRAM mask circuit using separate word and bit lines. With this arrangement, both the data value and the mask (care/don't care) value can be written and read simultaneously during read and write operations, respectively, thereby avoiding the difficult read and write operations required by some conventional ternary SRAM CAM cells.

In a first disclosed embodiment of the present invention, a 9-T ternary CAM cell is produced by using a 6-T binary CAM cell, a 2-T mask circuit, and the mask transistor. The binary SRAM CAM cell includes a 4-T latch that is connected to a bit line by a first pass transistor and to the match line by a second pass transistor. One of the transistors that forms the latch and is controlled by the data value stored in the latch is connected in series with the mask transistor and the second pass transistor, which is controlled by the applied data value, to form the discharge path between the match line and a discharge line. The resulting structure provides a highly space efficient ternary CAM cell.

In a second disclosed embodiment, a 10-T ternary CAM cell includes a 7-T binary SRAM CAM cell, a 2-T mask circuit, and the mask transistor. The binary SRAM CAM cell includes a 4-T latch that is connected to a bit line by a first pass transistor, to an inverted bit line by a second transistor, and to the mask transistor by a third pass transistor controlled by the applied data value. Similar to the first disclosed embodiment, one of the transistors that forms the latch is connected in series with the mask transistor and the third pass transistor to form the discharge path between the match line and a discharge line. However, in the second disclosed embodiment, the mask transistor is connected between a first terminal of the third pass transistor and the match line, and the latch is connected to ground/VSS. Because the latch is directly connected to ground/VSS, the second pass transistor and inverted bit line are provided to reliably write data values to (i.e., "flip") the latch of the binary SRAM CAM cell.

In a third disclosed embodiment, a 11-T ternary CAM cell includes an 8-T binary SRAM CAM cell, a 2-T mask circuit, and the mask transistor. The binary SRAM CAM cell includes a 4-T latch that is connected to a bit line by a first pass transistor, and to the mask transistor by a second pass transistor and a third pass transistor that are connected to opposite nodes, respectively, of the latch and are controlled by the applied data value and its inverse, respectively. The binary SRAM CAM cell also includes a pull-down transistor that is connected to a node located between the mask transistor and the third and fourth pass transistors. A first branch of the discharge path is formed by a first transistor of the latch that is connected in series with the mask transistor and the second pass transistor. A second branch of the discharge path is formed by a second transistor of the latch that is connected in series with the mask transistor and the third pass transistor. During write operations, the first pass transistor and the pull-down transistor are turned on, and one of the second and third pass transistors is turned on to store a desired data value in the latch. During match operations, one of the first and second branches of the discharge path are opened when the applied data value (or its inverse) fail to match the data value (or its inverse) that is stored in the latch.

In a fourth disclosed embodiment, another 11-T ternary CAM cell includes an 8-T binary SRAM CAM cell, a 2-T mask circuit, and the mask transistor. The binary SRAM CAM cell includes a 4-T latch that is connected to a bit line by a first pass transistor, to an inverted bit line by a second pass transistor, and to the mask transistor by a third pass transistor and a fourth pass transistor that are connected to opposite nodes, respectively, of the latch and are controlled by the applied data value and its inverse, respectively. A first branch of the discharge path is formed by a first transistor of the latch that is connected in series with the mask transistor and the third pass transistor. A second branch of the discharge path is formed by a second transistor of the latch that is connected in series with the mask transistor and the fourth pass transistor. During write operations, the first and second pass transistors are turned on to store a desired data value in the latch from the bit line and the inverted bit line. During match operations, one of the first and second branches of the discharge path are opened when the applied data value (or its inverse) fail to match the data value (or its inverse) that is stored in the latch.

In a fifth disclosed embodiment, a 13-T ternary CAM cell includes a 10-T binary SRAM CAM cell, a 2-T mask circuit, and the mask transistor. The binary SRAM CAM cell includes a 4-T latch that is connected to a bit line by a first pass transistor, and to an inverted bit line by a second pass transistor. A first node of the latch is connected to the gate terminal of a third pass transistor, which is connected in series with a fourth pass transistor and the mask transistor to form a first branch of the discharge path between the match line and the discharge line. A second node of the latch is connected to the gate terminal of a fifth pass transistor, which is connected in series with a sixth pass transistor and the mask transistor to form a second branch of the discharge path between the match line and the discharge line. The fourth and sixth pass transistors are controlled by the applied data value and its inverse, respectively. The discharge line is maintained in a floating state during read, write, and standby operations to conserve power. During match operations, one of the first and second branches of the discharge path are opened when the applied data value (or its inverse) fail to match the data value (or its inverse) that is stored in the latch.

In a sixth disclosed embodiment, a 12-T ternary CAM cell includes a 9-T binary SRAM CAM cell, a 2-T mask circuit, and the mask transistor. The binary SRAM CAM cell includes a 4-T latch that is connected to a bit line by a first pass transistor, and to an inverted bit line by a second pass transistor. A first node of the latch is connected to the gate terminal of a third pass transistor, and a second node of the latch is connected to the gate terminal of a fourth pass transistor. The third and fourth pass transistors are connected to a gate terminal of a fifth pass transistor, which is connected in series with the mask transistor to form the discharge path between the match line and the discharge line.

The present invention will be more fully understood in view of the following description and drawings.

BRIEF DESCRIPTION OF THE DRAWINGS

FIG. 1 is a simplified circuit diagram showing a ternary CAM cell according to the present invention;

FIGS. 2(A) and 2(B) are timing diagrams showing the operation of the ternary CAM cell of FIG. 1;

DETAILED DESCRIPTION

Figure 4:
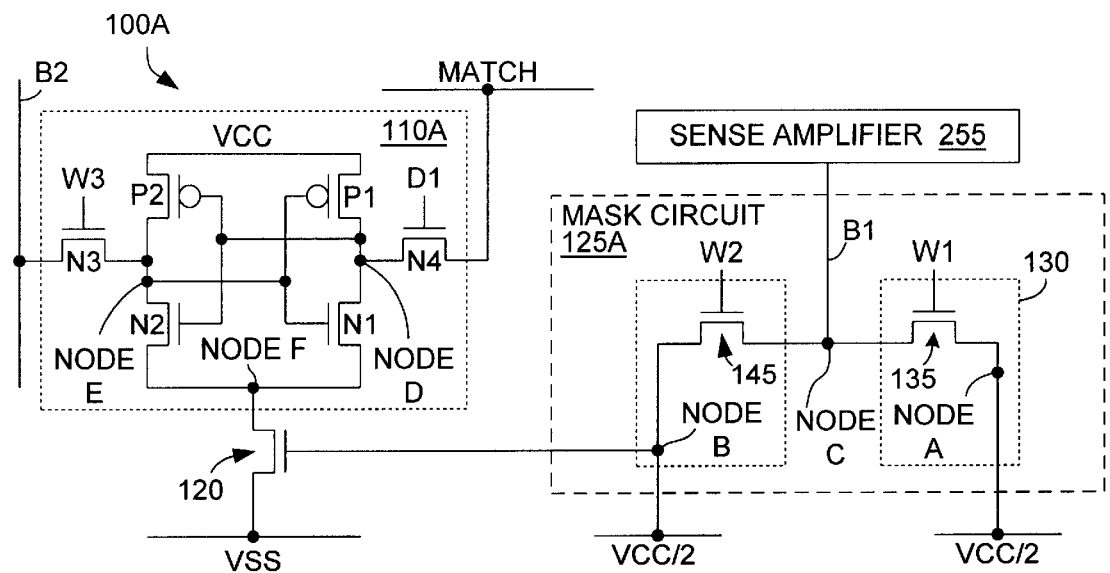
FIG. 4 is a circuit diagram showing a ternary CAM cell in accordance with a first specific embodiment of the present invention.

FIG. 1 is a simplified circuit diagram showing a ternary CAM cell 100 in accordance with the present invention. Ternary CAM cell 100 generally includes a binary SRAM CAM cell 110 and a mask transistor 120 that are connected in series between a match line (e.g., MATCH/DISCHARGE) and a discharge line (e.g., DISCHARGE/MATCH), and a mask circuit 125 for storing a mask (care/don't care) value and for transmitting the mask value to a gate terminal of mask transistor 120. In accordance with the present invention, binary SRAM CAM cell 110 includes a single latch for storing a data value that is compared with applied data values during match operations, and DRAM mask circuit 125 includes a first DRAM memory cell 130 and a second DRAM memory cell 140 that cooperatively store and continuously apply the mask value to the gate terminal of mask transistor 120. By combining binary SRAM CAM cell 110 and mask transistor 120 with DRAM mask circuit 125 in the manner described below, ternary CAM cell 100 provides the performance benefits of conventional SRAM CAM cells while using fewer transistors (and, hence, having a smaller size) than conventional ternary SRAM CAM cells.

Referring to the left side of FIG. 1, binary SRAM CAM cell 110 and mask transistor 120 form a discharge path between the match line and the discharge line. In the disclosed embodiment, mask transistor 120 is an n-channel transistor that is turned on (closed) by a high voltage signal and turned off (opened) by a low voltage signal. During match operations, binary SRAM CAM cell 110 compares data values transmitted on data line D1 with its stored data value, and opens the upper portion of the discharge path when the applied data value fails to match the stored data value. Mask transistor 120 performs the care/don't care function associated with ternary CAM cells in accordance with the mask value stored in DRAM mask circuit 125. When the mask value is logic "0" (i.e., low or "don't care"), mask transistor 120 is held open (turned off) such that the match line is unable to discharge even when a data value stored in binary SRAM CAM cell 110 fails to match the data value transmitted on data line D1. Conversely, when the mask value is logic "1" (i.e., high or "care"), mask transistor 120 is continuously closed (turned on) such that the match line discharges to the discharge line when a data value stored in binary CAM cell 110 fails to match a data value transmitted on data line D1.

In accordance with an aspect of the present invention, DRAM mask circuit 125 includes a first DRAM memory cell 130 and a second DRAM memory cell 140 that are connected to a bit line B1 (storage node NODE C). First DRAM memory cell 130 includes a storage node NODE A, and is controlled by a first word line W1 to connect storage node A to central node NODE C. Second DRAM memory cell 140 includes a storage node NODE B, and is controlled by a second word line W2 to connect storage node NODE B to central node NODE C. In addition storage node NODE B of second DRAM cell 140 is connected to the gate terminal of mask transistor 120 such that the mask value stored in storage node NODE B controls the on/off state of mask transistor 120. Because the first DRAM memory cell 130 and second DRAM memory cell 140 are connected to a single bit line B1 (central node NODE C), first DRAM memory cell 130 is capable of storing and refreshing the mask value stored in second DRAM memory cell 140 without requiring the mask value to be read from second DRAM memory cell 140.

FIGS. 2(A) and 2(B) are timing diagrams showing word line signals generated during a refresh operation of ternary CAM cell 100 (shown in FIG. 1). A read phase of the refresh operation begins by asserting first word line W1 at time T1 (see FIG. 2(A)). Referring back to FIG. 1, the high signal transmitted on first word line W1 writes a mask value stored in storage node NODE A to central node NODE C. A sense amplifier (not shown) connected to bit line B1 then reads and amplifies (refreshes) the mask value transmitted on bit line B1 from first DRAM memory cell 140. After a suitable set-up time (i.e., at time T2), a subsequent write phase of the refresh operation is initiated by asserting a second word line signal on word line W2, which is transmitted to second DRAM memory cell 140. The high signal on second word line W2 causes second DRAM memory cell 140 to pass (write) the refreshed mask value from bit line B1 to storage node NODE B. Accordingly, the mask value stored in second DRAM memory cell 140 and applied to mask transistor 120 is refreshed without reading the mask value from second DRAM memory cell 140, thereby avoiding problems associated with conventional single DRAM memory cell control circuits (discussed above).

FIG. 3 is a block diagram showing a simplified CAM circuit 200 that includes an array 210 of ternary CAM cells (TCC) 100(0,0) through 100(1,3). Ternary CAM cells 100(0,0) through 100(0,3) form a first row that is connected to word lines W1 through W3, which are controlled by word line control circuit 220, and match/discharge line M/D1 and discharge/match line D/M1, which are controlled by match/discharge line control circuit 230. Similarly, ternary CAM cells 100(1,0) through 100(1,3) form a second row that is connected to word lines W4 through W6, match/discharge line M/D2, and discharge/match line D/M2. Ternary CAM cells 100(0,0) and 100(1,0) form a first column that is connected to data line D1, which is controlled by data line control circuit 240, and bit lines B1 and B2, which are controlled by bit line control circuit 250. Similarly, columns formed by ternary CAM cells 100(0,1) and 100(1,1) are controlled by data line D2 and bit lines B3 and B4, ternary CAM cells 100(0,2) and 100(1,2) are controlled by data line D3 and bit lines B5 and B6, and ternary CAM cells 100(0,3) and 100(1,3) are controlled by data line D4 and bit lines B7 and B8.

In accordance with another aspect of the present invention, CAM circuit 200 facilitates reading data values from and writing data values to each row of ternary CAM cells using a single read/write operation. Referring briefly to FIG. 1, mask values are written to and read from each DRAM mask circuit 125 using a first and second word lines (e.g., W1 and W2) and a first bit line (e.g., B1), and data values are written to and read from each binary SRAM CAM cell 110 using a third word line (e.g., W3) and a second bit line (e.g., B2). Referring back to FIG. 3, with this arrangement, both the data value and the mask (care/don't care) values can be written and read simultaneously from an entire row of ternary CAM cells during read and write operations, respectively, thereby avoiding the difficult read and write operations required by the ternary SRAM CAM cell disclosed in U.S. Pat. No. 5,841,874 (discussed above). For example, mask values can be read from and written to ternary CAM cells 100(0,1) through 100(0,3) on bit lines B1, B3, B5 and B7 by asserting corresponding control signals on word lines W1 and W2 while data values are read from and written to ternary. CAM cells 100(0,1) through 100(0,3) on bit lines B2 by asserting corresponding control signals on word line W3.

FIGS. 4–9 are circuit diagrams showing ternary CAM cells 100A through 100F according to specific embodiments of the present invention.

FIG. 4 shows a 9-T ternary CAM cell 100A in accordance with a first specific embodiment of the present invention. Ternary CAM cell 100A includes a 6-T binary SRAM CAM cell 110A, a mask transistor 120, and a 2-T mask circuit 125A.

Mask circuit 125A includes first DRAM memory cell 130 and second DRAM cell 140 that, in the present embodiment, include single transistors connected between central node NODE C and their respective storage nodes. First DRAM memory cell 130 includes an n-channel pass transistor 135 that is connected between central node NODE C and storage node NODE A (i.e., a capacitor or wire), which is also coupled to an intermediate voltage VCC/2. The gate terminal of pass transistor 135 is controlled by a word line control signal transmitted on first word line W1. Similarly, second DRAM memory cell 140 includes an n-channel pass transistor 145 that is connected between central node NODE C and storage node NODE B, and is controlled by a word line control signal transmitted on second word line W2.

Ternary CAM cell 100A includes a 4-T latch, formed by p-channel transistors P1 and P2 and n-channel transistors N1 and N2, that is accessed during read/write operations by a fifth transistor N3, and accessed during match operations by a sixth transistor N4. First p-channel transistor P1 is connected between system voltage VCC and a first node NODE D, and has a gate terminal connected to a second node NODE E. First n-channel transistor N1 is connected between first node NODE D and a third node NODE F, and has a gate terminal connected to second node NODE E. Second p-channel transistor P2 is connected between system voltage VCC and second node NODE E, and has a gate terminal connected to first node NODE D. Second n-channel transistor N2 is connected between second node NODE E and third node NODE F, and has a gate terminal connected to first node NODE D. Third n-channel transistor N3 is connected between second node NODE E and second bit line B2, and has a gate terminal that is controlled by third word line W3. Fourth n-channel transistor N4 is connected between first node NODE D and match line MATCH, and has a gate terminal that is controlled by data line D1.

Mask transistor 120 combines with first n-channel transistor N1 and fourth n-channel transistor N4 of binary SRAM CAM cell 110A to form a discharge path between match line MATCH and discharge line VSS that is controlled by the data value stored in binary SRAM CAM cell 110A, the mask value stored in DRAM mask circuit 125A, and an applied data value transmitted on data line D1. Mask transistor 120 is connected between third node NODE F of binary SRAM CAM cell 110A and VSS, and is controlled by the mask value stored at node B of mask circuit 125A.

Read and write operations are performed by passing mask values to and from DRAM mask circuit 125A, and by passing data values to and from binary SRAM CAM cell 110A using bit lines B1 and B2, respectively. As mentioned above, because separate bit lines are used to transmit the data and mask values, both of these values can be written at the same time, thereby simplifying read and write operations. In particular, by asserting word lines W1 and W2 while applying a desired mask value on first bit line B1 and, at the same time, asserting word line W3 while applying a desired data value on second bit line B2, both the mask and data values are written to ternary CAM cell 100A simultaneously. Similarly, the data value stored at NODE E and the mask value stored at storage node NODE A are simultaneously read by asserting word lines W1 and W3.

A mask value written to match circuit 125A must be periodically refreshed. To overcome the read phase problems associated with single DRAM memory cell control circuits (discussed above), mask circuit 125A reads the mask value stored at storage node NODE A during a read phase of a refresh operation, and then writes this mask value into storage node NODE B during the write phase. Specifically, as discussed above with reference to FIGS. 2(A) and 2(B), word line W1 is asserted during the read phase to transmit the mask value stored at storage node NODE A onto bit line B1. A sense amplifier 255, which is part of bit line control circuit 250 (see FIG. 3), then senses and refreshes the mask value on bit line B1 (e.g., if logic "1", sense amplifier drives bit line B1 to a high (VCC) voltage level). During the subsequent write phase of the refresh operation, word line W2 is asserted, thereby passing the refreshed mask value from bit line B1 to storage node NODE B. Note that first word line W1 remains asserted during the write phase so that the mask value is re-written in first DRAM memory cell 130. This refresh operation is performed as often as necessary to maintain the mask value. Because the mask value is only written to storage node NODE B of second DRAM memory cell 140, the voltage level applied to the gate terminal of mask circuit 120 remains reliably refreshed, thereby avoiding erroneous operations associated with conventional single DRAM memory cell control circuits that occur, for example, when the voltage level associated with a logic "1" mask value drops below the threshold voltage of mask transistor 120.

With a data value stored in binary SRAM CAM cell 110A and the mask value stored in mask circuit 125A refreshed as described above, match operations are performed by ternary CAM cell 100A as follows. As mentioned above, care/don't are operations are controlled by the mask value stored in mask circuit 125A. Specifically, when a logic "0" (low voltage level) mask value is stored at storage node NODE B of mask circuit 125A, mask transistor 120 remains turned off, thereby preventing discharge of match line MATCH to discharge line VSS whether or not the data value stored at second node NODE E of binary CAM cell 110A fails to match a data value applied on data line D1. Conversely, when a logic "1" (high voltage level) mask value is stored at storage node NODE B of mask circuit 125A, mask transistor 120 is turned on (opened) to facilitate discharge of match line MATCH when the data value stored at second node NODE E of binary CAM cell 110A fails to match a data value applied on data line D1. Specifically, when the data value stored at storage node NODE E is high and the applied data value on data line D1 is high (indicating a non-match event), then a discharge path is opened between match line MATCH and discharge line VSS. Accordingly, the voltage level on the MATCH line is altered (e.g., discharged) to indicate a nonmatch has occurred.

Figure 5:
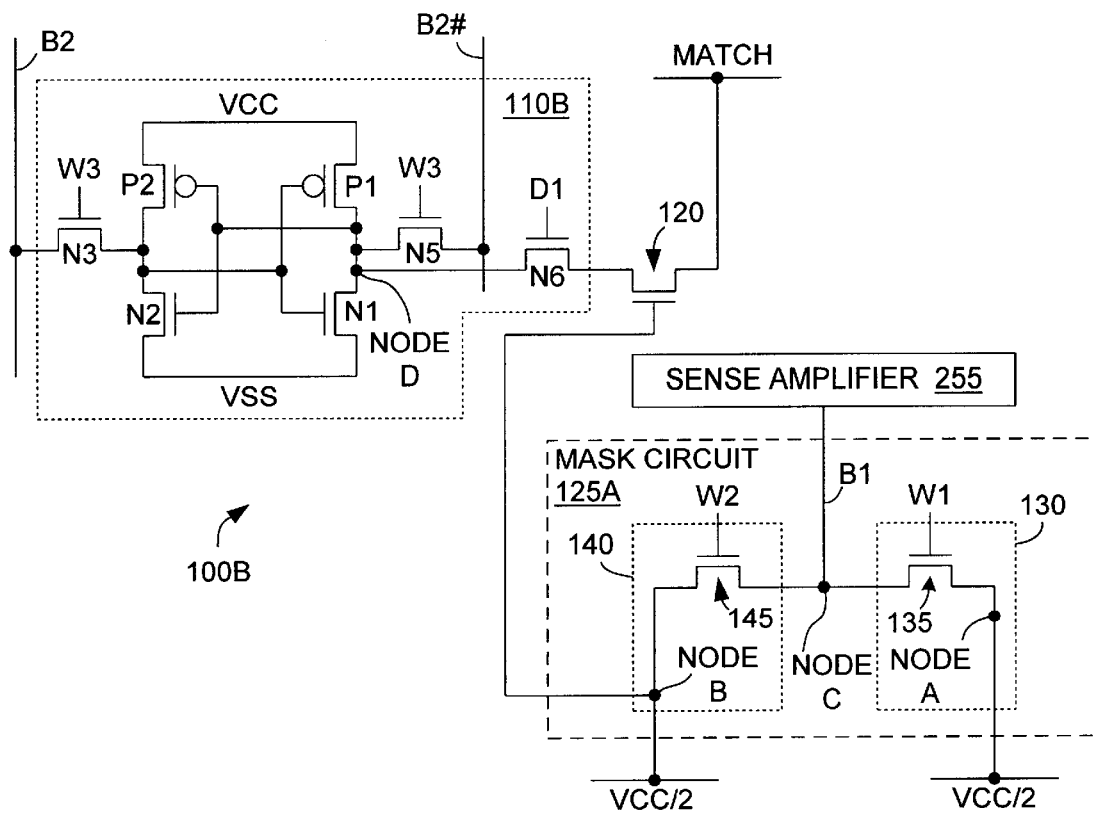
FIG. 5 is a circuit diagram showing a ternary CAM cell in accordance with a second specific embodiment of the present invention.

FIG. 5 shows a 10-T ternary CAM cell 100B in accordance with a second specific embodiment of the present invention. Ternary CAM cell 100B includes a 7-T binary SRAM CAM cell 110B, a mask transistor 120, and 2-T mask circuit 125A. Mask circuit 125A is identical to that described above with respect to ternary CAM cell 100A, and is therefore not discussed in detail below. Elements of 7-T binary SRAM CAM cell 110B that are similar to corresponding elements of 6-T binary SRAM CAM cell 110A (discussed above) are identified with common reference numbers.

Similar to ternary CAM cell 100A, ternary CAM cell 100B includes a 4-T latch formed by p-channel transistors P1 and P2 and n-channel transistors N1 and N2 that is accessed during read/write operations by a transistor N3, which is connected between second node E and non-inverted bit line B2, and by a transistor N5, which is connected between first node NODE D and an inverted bit line B2#. Both transistors N3 and N5 are controlled by word line W3. First node NODE D of the 4-T latch is connected to another transistor N6, which is controlled during match operations by an applied data value transmitted on data line D1. Note that the lower terminals of latch transistors N1 and N2 are connected directly to the discharge line, which in this embodiment is ground or VSS, instead of to the mask transistor as in the first embodiment (see FIG. 4). Accordingly, transistors N3 and N5 cooperate to reliably write data values that flip the latch formed by p-channel transistors P1 and P2 and n-channel transistors N1 and N2.

Also similar to ternary CAM cell 100A, mask transistor 120 combines with transistors N1 and N6 to form a discharge path between match line MATCH and discharge line VSS. However, in the second disclosed embodiment, mask transistor 120 is connected between a first terminal of transistor N6 and match line MATCH, and a second terminal of transistor N6 is connected to VSS (or ground).

Other than the use of two bit lines (B2 and B2#) during write operations, read, write, refresh, and match operations are performed by ternary CAM cell 100B in a manner similar to that described above with reference to ternary CAM cell 100A.

Figure 6:
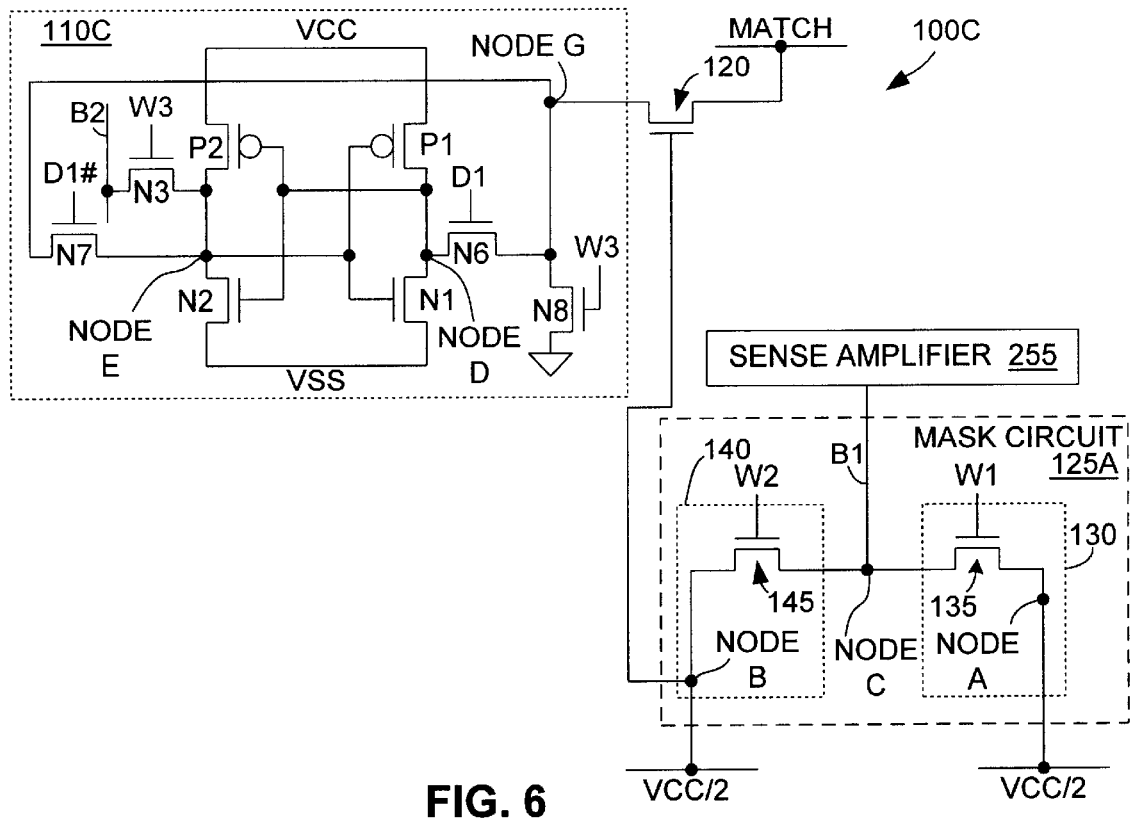
FIG. 6 is a circuit diagram showing a ternary CAM cell in accordance with a third specific embodiment of the present invention.

FIG. 6 shows an 11-T ternary CAM cell 100C in accordance with a third specific embodiment of the present invention. Ternary CAM cell 100C includes an 8-T binary SRAM CAM cell 110C, a mask transistor 120, and 2-T mask circuit 125A. Mask circuit 125A is identical to that described above. Elements of 8-T binary SRAM CAM cell 110C that are similar to corresponding elements of the binary SRAM CAM cells described above are identified with common reference numbers.

In addition to the 4-T latch and n-channel read/write transistor N3 that are described in the first and second specific embodiments, ternary CAM cell 100C includes pass transistors N6 and N7, and a pull-down transistor N8. Transistor N6 is connected between first node NODE D and a third node NODE G, and has a gate terminal controlled during match operations by an applied data value transmitted on data line D1. Transistor N7 is connected between second node NODE E and third node NODE G, and has a gate terminal controlled during match operations by an inverted applied data value transmitted on an inverted data line D1#, where the inverted data value is the logical inverse of the applied data value transmitted on data line D1. Pull-down transistor N8 is connected between third node NODE G and ground (low voltage source). Both transistor N3 and pull-down transistor N8 are controlled by word line W3. During write operations, first pass transistor N3 and pull-down transistor N8 are turned on by a high signal on word line W3, and one of second pass transistor N6 and third pass transistor N7 is turned on to connect a selected node (i.e., either NODE D or NODE E) of the latch to ground through pull-down transistor N8, thereby reliably flipping the latch into the desired state.

Referring to the upper right portion of FIG. 6, mask transistor 120 is connected between third node NODE G and match line MATCH, and is controlled by the mask value stored at storage node NODE B of mask circuit 125A. During match operations, a discharge path between match line MATCH and discharge line VSS can be formed on one of two branches when the data value stored by the latch fails to match the applied data value transmitted on data line D1 and the inverted applied data value transmitted on inverted data line D1#. The first branch is formed by mask transistor 120, pass transistor N6, and transistor N1 of the latch, and is opened when the data value stored at second node NODE E and the applied data value transmitted on data line D1 are both high. The second branch is formed by mask transistor 120, pass transistor N7, and latch transistor N2, and is opened when the data value stored at first node NODE D and the inverted applied data value transmitted on inverted data line D1# are both high. Of course, a "care" (logic "1" or high) mask value must also be stored in mask circuit 125A to turn on mask transistor 120 during the match operation.

Figure 7:
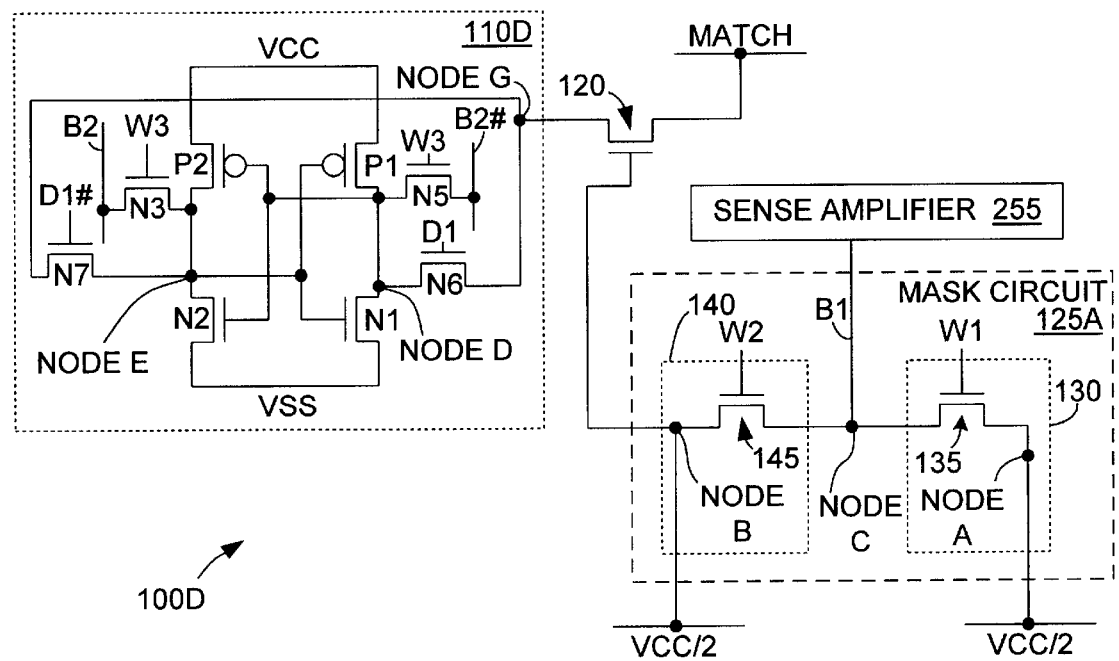
FIG. 7 is a circuit diagram showing a ternary CAM cell in accordance with a fourth specific embodiment of the present invention.

FIG. 7 shows another 11-T ternary CAM cell 100D in accordance with a fourth specific embodiment of the present invention. Ternary CAM cell 100D includes an 8-T binary SRAM CAM cell 110D, a mask transistor 120, and 2-T mask circuit 125A. Mask circuit 125A is identical to that described above. Elements of 8-T binary SRAM CAM cell 110D that are similar to corresponding elements of the binary SRAM CAM cells described above are identified with common reference numbers.

Ternary CAM cell 100D differs from ternary CAM cell 100C (FIG. 6) in that, instead of using pull-down transistor N8 (FIG. 6), binary SRAM CAM cell 110D includes pass transistor N5 that is connected between first node NODE D and an inverted bit line B2#. Accordingly, during write operations, word line W3 is asserted to turn on transistors N3 and N5, thereby writing a data value and its inverse through these transistors to first node NODE D and second node NODE E, respectively. Match, read, and refresh operations are performed as described above.

Figure 8:
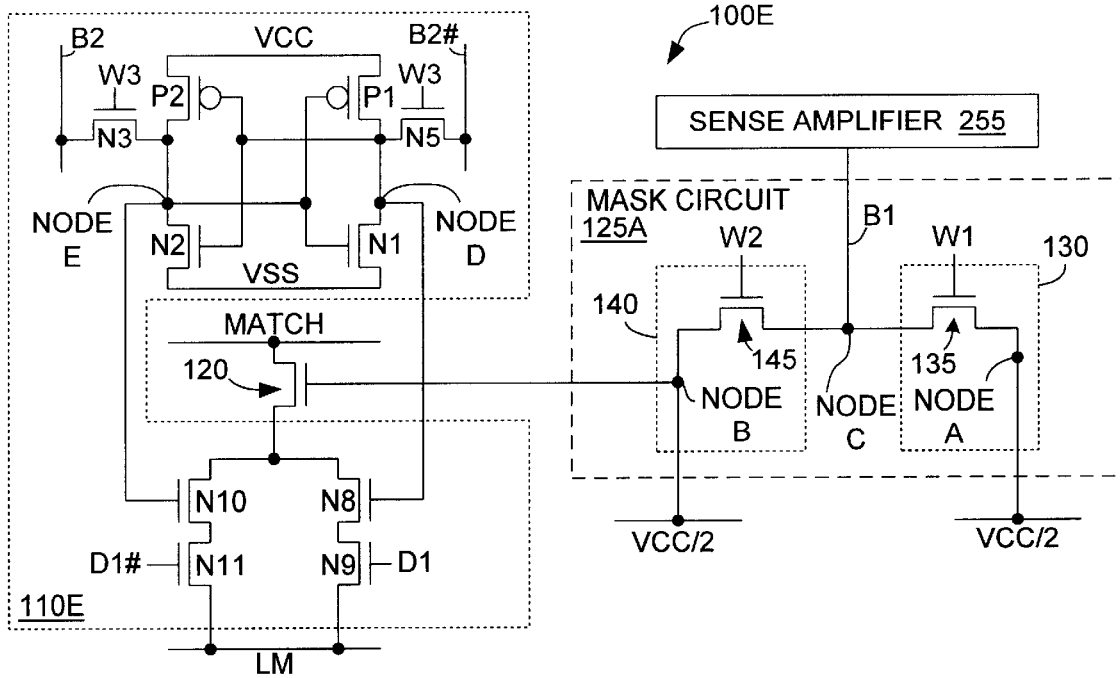
FIG. 8 is a circuit diagram showing a ternary CAM cell in accordance with a fifth specific embodiment of the present invention.

FIG. 8 shows a 13-T ternary CAM cell 100E in accordance with a fifth specific embodiment of the present invention. Ternary CAM cell 100E includes a 10-T binary SRAM CAM cell 110E, a mask transistor 120, and 2-T mask circuit 125A. Mask circuit 125A is identical to that described above. Elements of 8-T binary SRAM CAM cell 110E that are similar to corresponding elements of the binary SRAM CAM cells described above are identified with common reference numbers.

In addition to the 4-T latch (formed by transistors N1, N2, P1, and P2) and read/write transistor N3, which are described in the first and second specific embodiments, ternary CAM cell 100E includes pass transistors N8, N9, N10, and N11. First node NODE D of the latch is connected to the gate terminal of pass transistor N8, which is connected in series with pass transistor N9 and mask transistor 120 to form a first branch of the discharge path between match line MATCH and discharge line LM. Second node NODE E of the latch is connected to the gate terminal of pass transistor N10, which is connected in series with pass transistor N11 and mask transistor 120 to form a second branch of the discharge path between match line MATCH and the discharge line. Transistors N9 and N11 are controlled by an applied data value transmitted on data line D1 and an inverted applied data value transmitted on inverted data line D1#, respectively.

During a match operation, discharge (low match) line LM is maintained at a predetermined low voltage (e.g., VSS) and an applied data value (and its inverse) is transmitted on data line D1 (and inverted data line D1#). When a "care" (logic "1" or high) mask value is stored in mask circuit 125A, thereby turning on mask transistor 120, a discharge path is opened between match line MATCH and discharge line LM when both the data value stored at first node NODE D and the applied data value are high, thereby turning on transistors N8 and N9, or when both the inverted data value stored at second node NODE E and the inverted applied data value are high, thereby turning on transistors N10 and N11.

To reduce power consumption, discharge line LM differs from the fixed voltage discharge lines (e.g., ground) used in the previous embodiments in that, during read, write, and standby operations, discharge line LM is maintained in a floating state by match line control circuit 230 (see FIG. 3). As described above, discharge line LM is pulled down to a predetermined low voltage during match operations.

Figure 9:
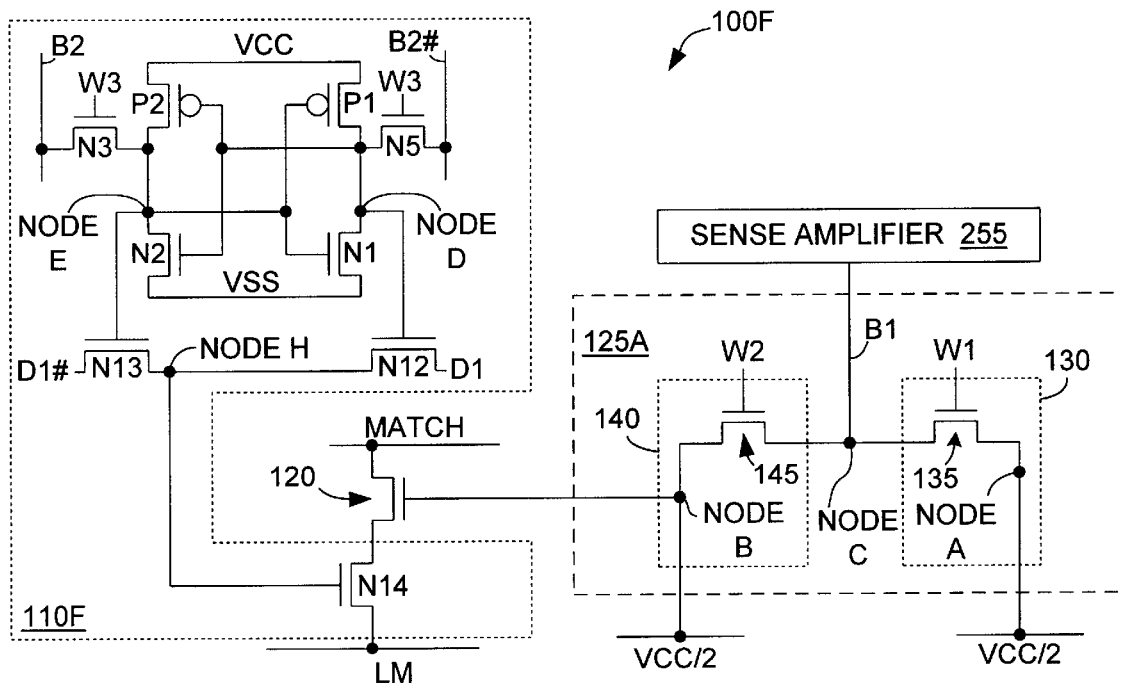
FIG. 9 is a circuit diagram showing a ternary CAM cell in accordance with a sixth specific embodiment of the present invention.
Figure 10:
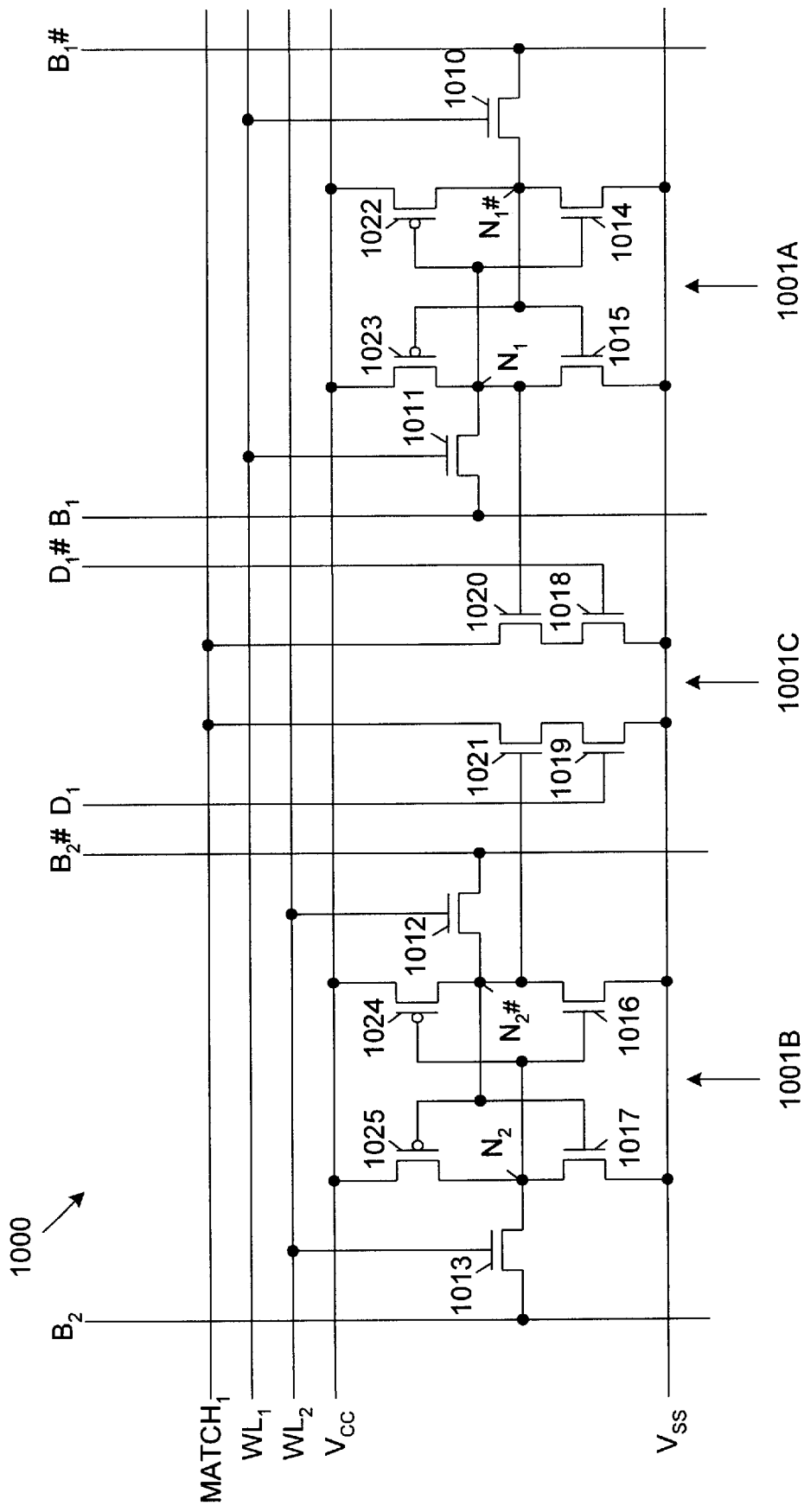
FIG. 10 is a circuit diagram showing a conventional 16-T ternary SRAM CAM cell.

FIG. 9 shows a 12-T ternary CAM cell 100F in accordance with a sixth specific embodiment of the present invention. Ternary CAM cell 100F includes a 9-T binary SRAM CAM cell 110F, a mask transistor 120, and 2-T mask circuit 125A. Mask circuit 125A is identical to that described above. Elements of 8-T binary SRAM CAM cell 110E that are similar to corresponding elements of the binary SRAM CAM cells described above are identified with common reference numbers.

Binary SRAM CAM cell 110F includes the 4-T latch (formed by transistors N1, N2, P1, and P2) and read/write transistor N3 of the above-described embodiments, and also includes pass transistors N12, N13, and N14. First node NODE D of the latch is connected to the gate terminal of transistor N12, and second node NODE E is connected to the gate terminal of transistor N13. A first terminal of transistor N12 is connected to data line D1, and a second terminal of transistor N12 is connected to a third node NODE H. Similarly, a first terminal of transistor N13 is connected to inverted data line D1#, and a second terminal of transistor N13 is connected to third node NODE H. Transistor N14 is connected in series with the mask transistor 120 between match line MATCH and the discharge line LM, which operates in the manner described above with reference to the fifth embodiment. The gate terminal of transistor N14 is connected to third node NODE H. During a match operation, when a "care" (logic "1" or high) mask value is stored in mask circuit 125A, thereby turning on mask transistor 120, a discharge path is opened between match line MATCH and discharge line LM when both the data value stored at first node NODE D and the applied data value transmitted on data line D1 are high, or when both the inverted data value stored at second node NODE E and the inverted applied data value transmitted on inverted data line D1# are high. In either of these instances, the high data value is transmitted to the gate terminal of transistor N14, thereby forming a discharge path with turned on mask transistor 120. Read, write, and refresh operations are performed as described above.

Although the present invention has been described with reference to several specific embodiments, those of ordinary skill in the art will recognize that novel aspects of the present invention can be utilized in various additional ternary and quad (four state) CAM cells. In view of these and other possible modifications, the invention is limited only by the following claims.

What is claimed is:

1. A ternary CAM cell comprising:
    a binary CAM cell coupled in a discharge path between a match line and a discharge line;
    a mask transistor connected in series with the CAM cell in the discharge path; and
    a mask circuit for storing a mask value and applying the mask value to a gate terminal of the mask transistor, the mask memory circuit including:
        a first DRAM memory cell connected to a central node and having a first storage node for storing the mask value; and
        a second DRAM memory cell connected to the central node and having a second storage node for storing the mask value.

2. The ternary CAM cell according to claim 1,
    wherein the first DRAM memory cell comprises a first transistor connected between the central node and the first storage node,
    wherein the second DRAM memory cell comprises a second transistor connected between the central node and the second storage node, and
    wherein the second storage node is connected to a gate terminal of the mask transistor such that the mask value stored at the second storage node is directly applied to the gate terminal of the mask transistor.

3. The ternary CAM cell according to claim 1, wherein the binary CAM cell is a binary SRAM CAM cell.

4. The ternary CAM cell according to claim 3,
    wherein the binary SRAM CAM cell comprises:
        a latch including a first n-channel transistor connected between a first nod and a first terminal of the mask transistor, the first n-channel transistor being controlled by a data value stored at a second node of the latch; and
        a second n-channel transistor connected between the match line and the first node, second n-channel transistor being controlled by an applied data value, and
        wherein a second terminal of the mask transistor is connected to the discharge line.

5. The ternary CAM cell according to claim 3, wherein the binary SRAM CAM cell comprises:
    a latch including a first n-channel transistor connected between a first node and the discharge line, the first n-channel transistor being controlled by a data value stored at a second node of the latch; and
    a second n-channel transistor connected between the first node and a first terminal of the mask transistor, the second n-channel transistor being controlled by an applied data value, and
    wherein a second terminal of the mask transistor is connected to the match line.

6. The ternary CAM cell according to claim 3,
wherein the binary SRAM CAM cell comprises:
a latch including a first transistor and a second transistor, the first transistor being connected between a first node and the discharge line and having a gate terminal controlled by a data value stored at a second node of the latch, the second transistor being connected between the second node and the discharge line and having a gate terminal controlled by an inverted data value stored at the first node;
a third transistor connected between the first node and a first terminal of the mask transistor, the third transistor being controlled by an applied data value;
a fourth transistor connected between the second node and the first terminal of the mask transistor, the fourth transistor being controlled by an inverted applied data value, and
wherein a second terminal of the mask transistor is connected to the match line.

7. The ternary CAM cell according to claim 6, further comprising a pull-down transistor connected between the first terminal of the mask transistor and a low voltage source.

8. The ternary CAM cell according to claim 3,
wherein the binary SRAM CAM cell comprises:
a latch defining a first node for storing a data value;
a first pass transistor having a first terminal connected to a first terminal of the mask transistor and having a gate terminal connected to the first node; and
a second pass transistor connected between a second terminal of the first pass transistor and the discharge line,
wherein a second terminal of the mask transistor is connected to the match line.

9. The ternary CAM cell according to claim 3,
wherein the binary SRAM CAM cell comprises:
a latch defining a first node for storing a data value and a second node for storing an inverted data value;
a first pass transistor having a gate terminal connected to the first node, a first terminal connected to receive an applied data value, and a second terminal connected to a third node;
a second pass transistor having a gate terminal connected to the second node, a first terminal connected to receive an inverted applied data value, and a second terminal connected to the third node; and
a third pass transistor connected in series with the mask transistor between the match line and the discharge line, wherein a gate terminal of the third pass transistor is connected to the third node.

10. A CAM circuit including an array of ternary CAM cells arranged in rows and columns, wherein each ternary CAM cell comprises:
a binary CAM cell coupled in a discharge path between a match line and a discharge line;
a mask transistor connected in series with the CAM cell in the discharge path; and
a mask circuit for applying a mask value to a gate terminal of the mask transistor, the mask circuit including:
a first DRAM memory cell connected to a central node and having a first storage node for storing the mask value; and
a second DRAM memory cell connected to the central node and having a second storage node for storing the mask value.

11. The CAM circuit according to claim 10,
wherein the first DRAM memory cell comprises a first transistor connected between the central node and the first storage node,
wherein the second DRAM memory cell comprises a second transistor connected between the central node and the second storage node, and
wherein the second storage node is connected to a gate terminal of the mask transistor such that the mask value stored at the second storage node is directly applied to the gate terminal of the mask transistor.

12. The CAM circuit according to claim 11, further comprising a sense amplifier for sensing a voltage level at the central node and for amplifying the sensed voltage level.

13. The CAM circuit according to claim 12, further comprising means for turning on the first transistor such that the mask value stored at the first storage node is transmitted to the central node, and then turning on the second transistor after the sense amplifier senses and amplifies the mask value at the central node such that the mask value is transmitted to the second storage node, thereby refreshing the mask value stored at the second storage node.

14. The CAM circuit according to claim 10, wherein the binary CAM cell is an SRAM CAM cell.

15. A method for operating a ternary CAM circuit including a binary CAM cell connected in series with a mask transistor between a match line and a discharge line, and a DRAM mask circuit for storing a mask value used to control the mask transistor, the method comprising:
storing a data value in the binary CAM cell and a mask value in the DRAM mask circuit;
refreshing the mask value in the DRAM mask circuit by reading the mask value from a first DRAM memory cell during a read phase, and writing the mask value to a second DRAM memory cell during a write phase; and
continuously applying the mask value stored by the second DRAM memory cell to a gate terminal of the mask transistor.

16. The method for operating a ternary CAM circuit according to claim 15, wherein storing the data value in the binary CAM cell comprises writing the data value into an SRAM latch.

17. The method for operating a ternary CAM circuit according to claim 15, wherein storing the mask value in the DRAM mask circuit comprises:
transmitting the mask value to the central node, and
simultaneously turning on a first transistor connected between a first storage node and the central node using a control signal transmitted on a first word line, and a second transistor connected between a second storage node and the central node using the control signal transmitted on a second word line.

18. The method for operating a ternary CAM circuit according to claim 15,
wherein reading the mask value from a first DRAM memory cell during the read phase comprises turning on a first transistor connected between a first storage node and a central node using a first control signal transmitted on a first word line,
wherein writing the mask value to the second DRAM memory cell during the write phase comprises turning on a second transistor connected between a second storage node and the central node using a second control signal transmitted on a second word line, and
wherein continuously applying the mask value stored by the second DRAM memory cell comprises transmitting the mask value from the second storage node to the gate terminal of the mask transistor.

19. The method for operating a ternary CAM circuit according to claim 16, wherein reading the mask value from the first DRAM memory cell comprises transmitting the mask value on a bit line to a sense amplifier.

20. The method for operating a ternary CAM circuit according to claim 15, further comprising performing a match operation by applying a data value to the binary CAM cell, wherein the binary CAM cell and the mask transistor form a discharge path between the match line and the discharge line when the applied data value fails to match the data value stored in the binary CAM cell and the mask value turns on the mask transistor.

21. The method for operating a ternary CAM circuit according to claim 15, further comprising performing a read operation by reading the data value from the binary CAM cell and reading the mask value from the DRAM mask circuit.

* * * * *